(12) United States Patent
Fiedler (10) Patent No.: US 7,446,576 B2
(45) Date of Patent: Nov. 4, 2008

(54) OUTPUT DRIVER WITH SLEW RATE CONTROL

(75) Inventor: Alan Fiedler, Niskayuna, NY (US)

(73) Assignee: SLT Logics, LLC, Boston, MA (US)

( * ) Notice: Subject to any disclaimer, the term of this patent is extended or adjusted under 35 U.S.C. 154(b) by 0 days.

(21) Appl. No.: 11/241,233

(22) Filed: Sep. 30, 2005

(65) Prior Publication Data

US 2007/0188207 A1 Aug. 16, 2007
US 2008/0054969 A2 Mar. 6, 2008

(51) Int. Cl.
*H03B 1/00* (2006.01)

(52) U.S. Cl. .................. 327/108; 327/170; 326/82; 326/86

(58) Field of Classification Search .......... 327/170, 327/108, 109, 112; 330/260; 326/82, 83, 326/86
See application file for complete search history.

(56) References Cited

U.S. PATENT DOCUMENTS

| | | | | | |
|---|---|---|---|---|---|
| 3,845,404 | A | * | 10/1974 | Trilling | .................. 330/69 |
| 4,578,647 | A | * | 3/1986 | Sasamura | ................. 330/253 |
| 5,587,674 | A | * | 12/1996 | Danstrom | ................. 327/67 |
| 6,107,882 | A | * | 8/2000 | Gabara et al. | .............. 330/253 |
| 6,429,700 | B1 | * | 8/2002 | Yang | ................. 327/108 |
| 6,476,654 | B2 | | 11/2002 | Tanaka | |
| 6,628,150 | B1 | * | 9/2003 | Carvajal et al. | ............. 327/108 |
| 6,664,820 | B1 | * | 12/2003 | Estrada | ................. 327/108 |
| 6,665,354 | B1 | * | 12/2003 | Drapkin et al. | ............. 375/316 |
| 6,803,820 | B1 | * | 10/2004 | Muljono | ................. 330/258 |
| 6,847,232 | B2 | * | 1/2005 | Tinsley et al. | ................. 326/84 |
| 6,870,390 | B1 | | 3/2005 | Groen et al. | |
| 6,873,209 | B2 | * | 3/2005 | Takata et al. | ................ 330/253 |
| 7,061,273 | B2 | * | 6/2006 | Wang et al. | .................. 326/86 |
| 7,298,210 | B2 | * | 11/2007 | Alenin et al. | ................ 330/259 |
| 7,301,371 | B2 | * | 11/2007 | Kim | ............................. 326/82 |
| 2003/0020519 | A1 | * | 1/2003 | Leung et al. | ................. 327/108 |
| 2003/0085737 | A1 | * | 5/2003 | Tinsley et al. | ................. 326/86 |
| 2003/0151431 | A1 | * | 8/2003 | Morgan et al. | ............. 327/108 |
| 2005/0231252 | A1 | | 10/2005 | Kim | |
| 2005/0285646 | A1 | | 12/2005 | Rashid | |
| 2006/0017463 | A1 | * | 1/2006 | Kasanyal et al. | .............. 326/82 |

* cited by examiner

*Primary Examiner*—N. Drew Richards
*Assistant Examiner*—William Hernandez
(74) *Attorney, Agent, or Firm*—Patterson, Thuente, Skaar & Christensen, P.A.

(57) ABSTRACT

A circuit and method for controlling a slew rate of an output buffer. A pre-driver is provided that drives an input of an output pad driver of the output buffer. An output slew rate of the pre-driver is electronically selected among at least two electronically selectable slew rates. An output amplitude of the pre-driver is controlled such that the output amplitude is not greater than an amplitude that is generally minimally sufficient to cause the output pad driver to produce an output signal having a desired dynamic range.

16 Claims, 8 Drawing Sheets

PRE-DRIVER CIRCUIT

PRE-DRIVER BIASING WITH REPLICA PRE-DRIVER

OUTPUT DRIVER WITH SLEW RATE CONTROL

FIELD OF THE INVENTION

The present invention generally relates to integrated circuits, and more particularly to an output buffer with slew rate control, and systems and methods employing such an output buffer suitable for high speed data applications in integrated circuits.

BACKGROUND OF THE INVENTION

Integrated circuits (ICs) utilize output buffers for driving the output signaling through a transmission medium (such as traces on a circuit board) and through the load of the destination circuit. Output buffers are generally comprised of pads that form the external electronic connection mechanism and drivers that supply other output power for an output signal. The design of output buffers should address waveshaping, load handling, switching speed, and reliability concerns. It is generally desirable for high speed, resistively terminated, output buffers to satisfy two design criteria for optimum performance. First, the output resistance should match the characteristic impedance of the transmission medium. Second, the output buffer's switching speed, or slew rate, should be as slow as tolerable so as to minimize reflections and electromagnetic interference (EMI), yet still fast enough to fully switch between high and low logic levels during the data setup time durations between sampling events at the destination circuit.

Known approaches for controlling the slew rate of common mode logic (CML) type output buffers include complicated designs and implemtations, including rapid, sequential switching between small output drivers connected in parallel to a single pad. Complex designs with small feature sizes are susceptible to manufacturing defects 7 that reduce production yield and increase device cost. Small device features in output pads are also susceptible to electrostatic discharge (ESD) and other fast transient phenomena, which also adversely affect manufacturing yield, but also result in field failures including sleeping (latent) failures.

An output buffer circuit and method that addresses these, and other problems, is therefore desirable.

SUMMARY OF THE INVENTION

A signal driver circuit is provided with a controllable slew rate. The circuit preferably comprises a pre-driver sub-circuit that includes a differential arrangement of gain elements and an adjustable load. Adjustment of the load varies the pre-driver's output slew rate. An output driver sub-circuit has an input coupled with the pre-driver's output, and the output driver's output slew rate and amplitude are based on the slew rate and amplitude of the pre-driver's output. A feedback arrangement is coupled to the output driver and to the pre-driver, and operates to control the amplitude of the pre-driver's output based on an output amplitude of the output driver.

A method of controlling a slew rate of an output buffer is provided according to another aspect of the invention by a pre-driver that drives an input of an output pad driver. An output slew rate of the pre-driver is electronically selected among at least two electronically selectable slew rates. An output amplitude of the pre-driver is controlled such that the output amplitude is not greater than an amplitude that is generally minimally sufficient to cause the output pad driver to produce an output signal having a desired dynamic range.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be used and structural or logical changes may be made without departing from the scope of the present invention. The following detailed description, therefore, is not to be taken in a limiting sense.

Generally, the present invention provides an output buffer or, more generally, an output driver that is coupled to an output port, with slew rate control suitable for use in integrated circuits, including high speed data applications. The slew rate of the output buffer is controlled by controlling the slew rate and amplitude of the input signal resulting in a slew rate which is as slow as possible, yet fast enough to fully switch between high and low levels and settle at the desired level for a sufficient time duration.

A first exemplary embodiment of the invention is an output buffer comprising a differential output buffer circuit having a controlled output signal slew rate which is as slow as possible, yet fast enough to fully switch between high and low levels. In another embodiment, the buffer may comprise an input signal provided to the differential output buffer circuit for controlling the output signal slew rate, including a controlled input signal slew rate and amplitude. The buffer may further comprise a pre-driver circuit having a variable resistance load for controlling the input signal slew rate; and a feedback loop including a feedback circuit coupled to the pre-driver circuit for controlling the amplitude of the input signal. In an alternate embodiment, the feedback circuit controls the input signal amplitude to be substantially equal to the amplitude required to switch the output buffer between a high and low state and in yet another embodiment of the invention, the feedback circuit controls the input signal amplitude to be just greater than the amplitude required to switch the output buffer between a high and low state. Persons skilled in the relevant arts will recognize that the invention has numerous applications in systems utilizing high speed data switching.

Figure 1:
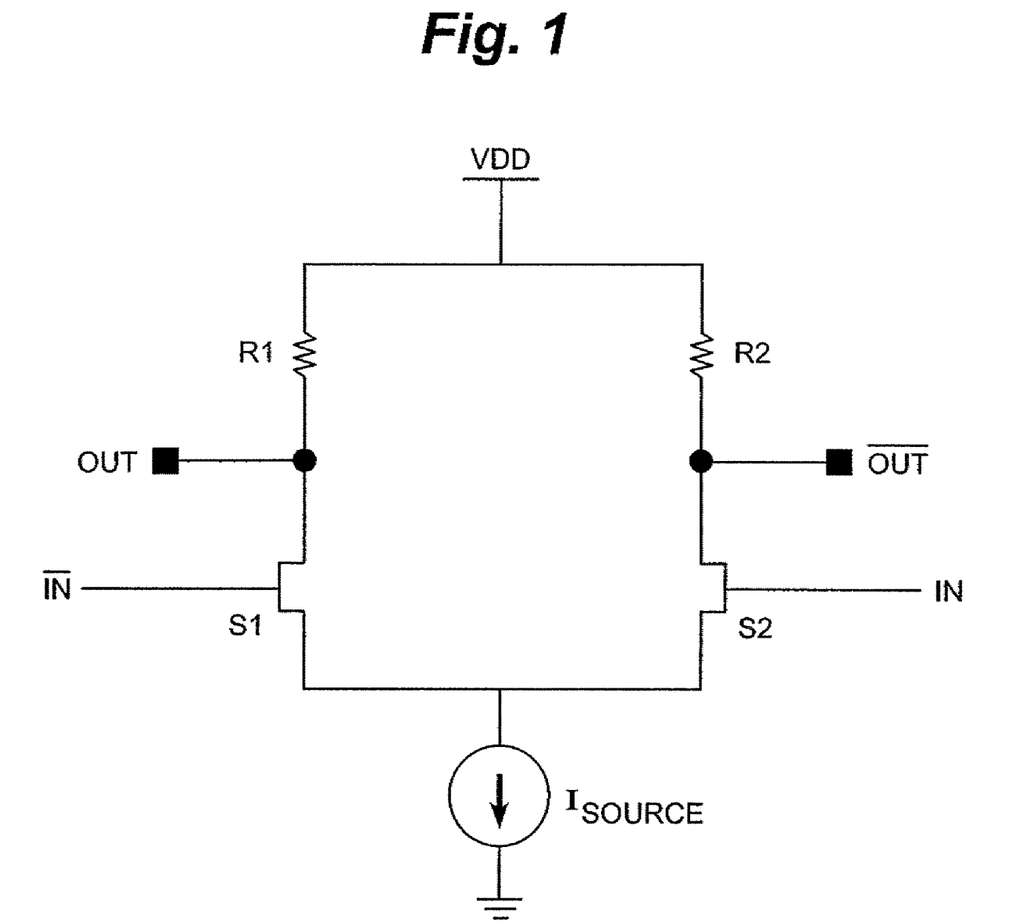
FIG. 1 is a diagram illustrating one exemplary embodiment of an output buffer having a controlled slew rate according to the present invention.

FIG. 1 is a diagram illustrating one exemplary embodiment of an output buffer having a controlled slew rate according to the present invention. The output buffer is a differential output buffer suitable for use in high speed data applications. In accordance with the present invention, the slew rate and amplitude of the input signal to the output buffer are controlled, providing an output slew rate as slow as possible so as to minimize reflections, yet fast enough to adequately switch between high and low levels.

The output buffer includes resistor R1, switch S1, resistor R2, switch S2 and current source Isource coupled between supply voltage VDD and reference ground. The differential output buffer includes output signal OUT and output signal $\overline{OUT}$, and receives input signal IN and input signal $\overline{IN}$. In one embodiment, switch S1 and switch S2 are NFET transistors operating a switch which conducts when their respective gate is high. It will be apparent to one skilled in the art after reading the present application that switch S1 and switch S2 may comprise other circuit components, such as PFET transistors, bipolar transistors, and/or other suitable gain elements.

Figure 2:
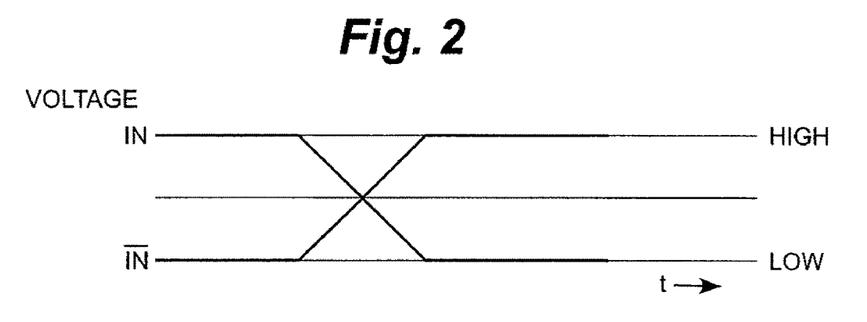
FIG. 2 is a diagram illustrating one exemplary embodiment of input signals provided the output buffer of FIG. 1.
Figure 3:
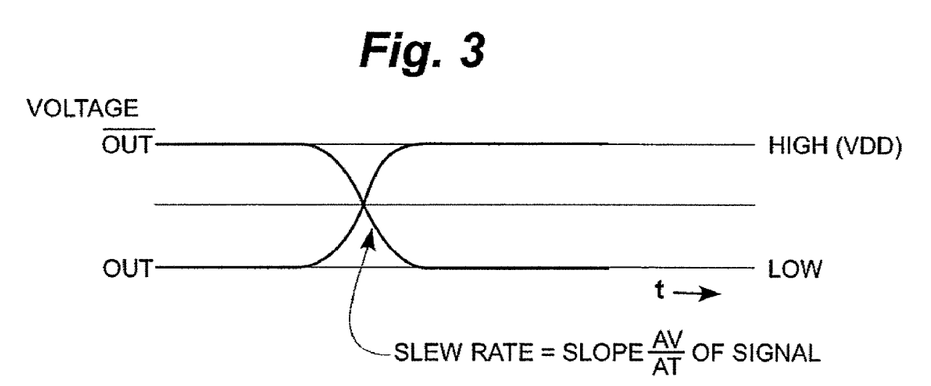
FIG. 3 is a diagram illustrating one exemplary embodiment of output signals from the output buffer of FIG. 1.

FIGS. 2 and 3 are diagrams illustrating one exemplary embodiment of input signals and corresponding output signals for the output buffer of FIG. 1. When input signal IN is high, switch S2 is conducting and output signal $\overline{OUT}$ is high. When input signal $\overline{IN}$ is low switch S1 is not conducting and corresponding output voltage signal OUT is low. When input voltage signal IN is brought low and $\overline{IN}$ is brought high, switch S1 will turn on and switch S2 will turn off. Corresponding output voltage $\overline{OUT}$ will transition low and output voltage signal OUT will transition high.

The slew rate of the output buffer is defined by the slope of the output signal (i.e., the change in voltage over the change in time). In accordance with the present invention, it is desirable to control the slew rate of the output buffer to be as slow as possible so as to minimize reflections, yet fast enough to fully switch the output buffer between high and low levels.

Figure 4:
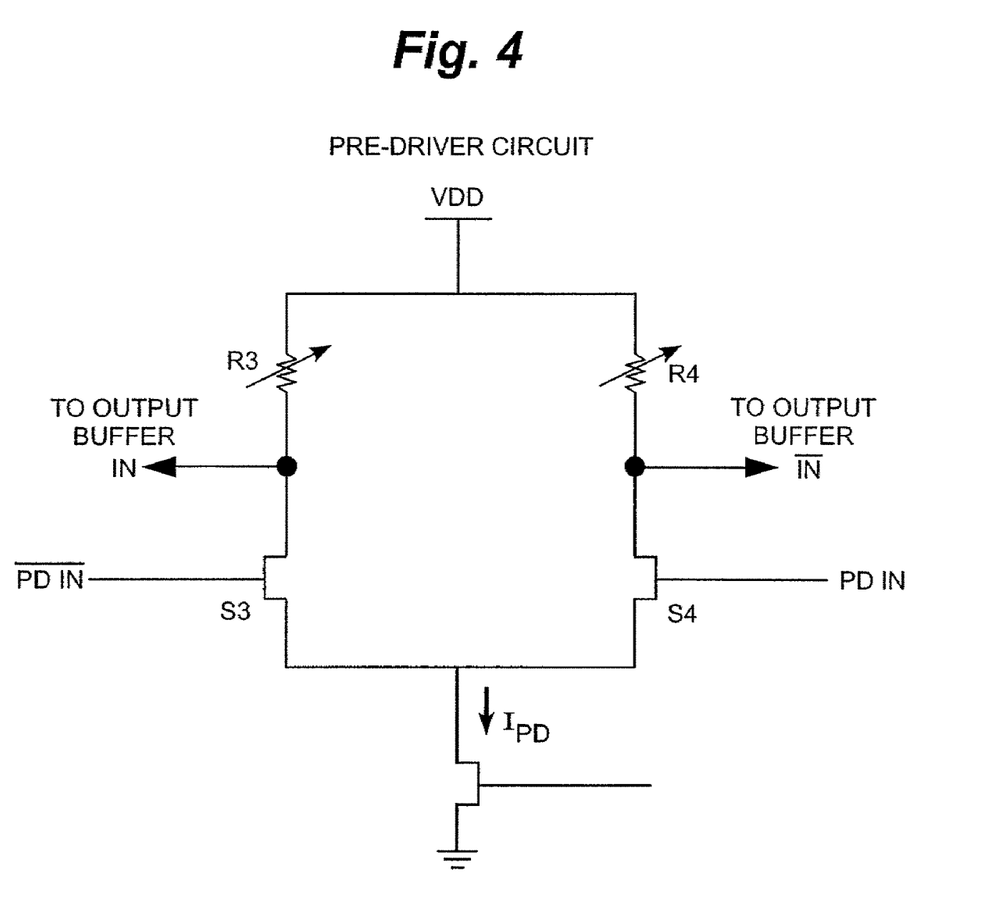
FIG. 4 is a diagram illustrating one exemplary embodiment of a pre-driver circuit for providing a controlled input slew rate and amplitude to the output buffer of FIG. 1.

FIG. 4 is a diagram illustrating one exemplary embodiment of a pre-driver circuit for providing a controlled input slew rate and amplitude input signals to the output buffer of FIG. 1. By controlling the output slew rate and amplitude of the pre-driver, the slew rate of the output buffer is then controlled.

In particular, the pre-driver circuit is similar to the differential output buffer circuit, and includes a switchable resistive load R3 and a switchable resistive load R4, transistor switches S3 and S4, and current source IPD, modeled as an NFET transistor having its source tied to reference ground.

The slew rate of the pre-driver circuit is controlled by means of switchable resistive pre-driver resistive loads R3 and R4. In particular, the slew rate of the predriver circuit corresponds to the RC time constant associated with the circuit. The capacitive load of the circuit is generally fixed, attributed to the capacitance of switch S3 and S4 and other parasitic capacitance. Accordingly, the RC time constant changes by changing the resistive load. With a fixed capacitance when the resistance gets larger, there is less current flowing the circuit and the RC time constant increases. As such, when the pre-driver load resistance is low, the slew rate is fast. When the pre-driver load resistance is higher, the slew rate is slower.

The pre-driver output amplitude is controlled by controlling the magnitude of current IPD. The magnitude of current IPD can be controlled by controlling the voltage at the current source. In reference also to FIG. 5, the pre-driver output amplitude in one embodiment is generally matched with the input of the output driver sub-circuit such that the pre-driver's output is minimally sufficient to achieve complete switching (i.e. a desired dynamic range) of the output driver's output. A minimally sufficient pre-driver output can be slightly larger than the absolute minimum amplitude needed to completely switch the output buffer. In one such embodiment, a small excess safety Vmargin ensures reliable switching over potentially changing conditions such as noise floor or temperature.

Figure 5:
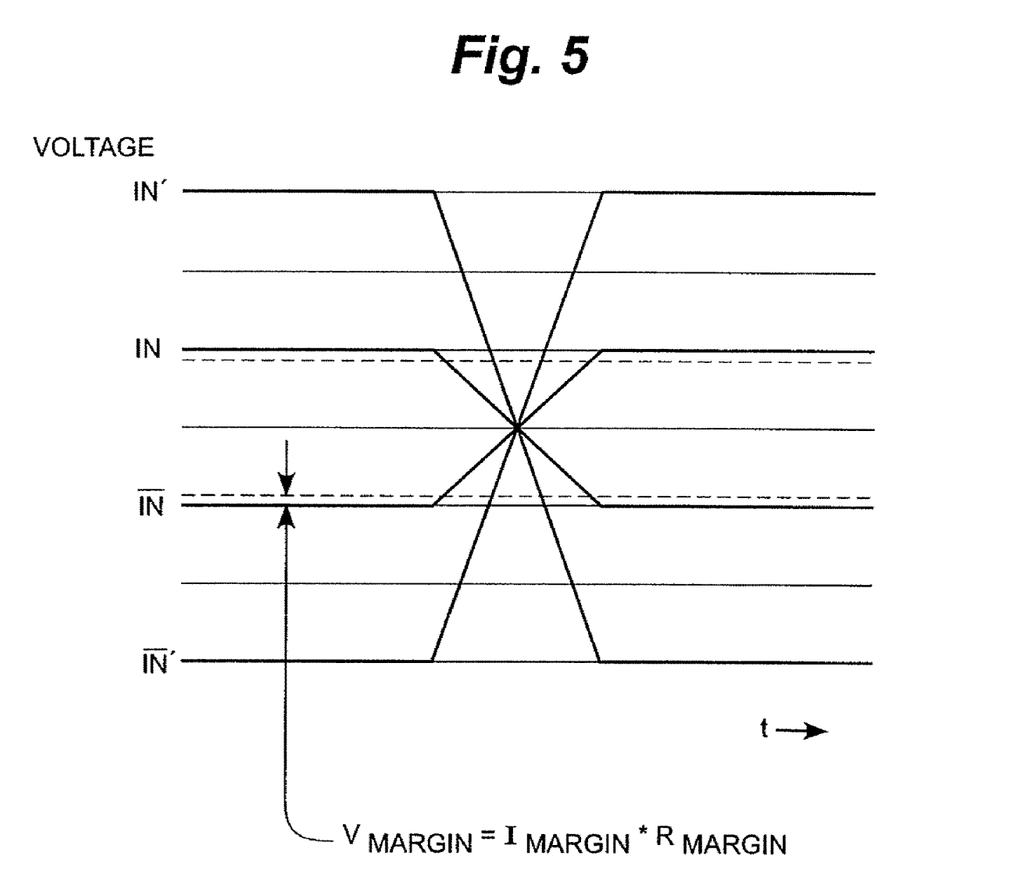
FIG. 5 is a diagram illustrating another exemplary embodiments of input signals to an output buffer according to the present invention.

The minimum amplitude (or dynamic range) necessary to completely switch the output buffer is represented by the dashed line in FIG. 5. In one embodiment, it is desirable to provide a signal amplitude which is large enough to completely switch the output buffer, but not too large. As such, the voltage amplitude for IN' and $\overline{IN}'$ is too large. In one embodiment, a small safety margin is added to input signals IN and $\overline{IN}$ (noted by Vmargin) resulting in a pre-driver output signal amplitude which is just a bit larger than that needed to reliably completely switch the output buffer.

Figure 6:
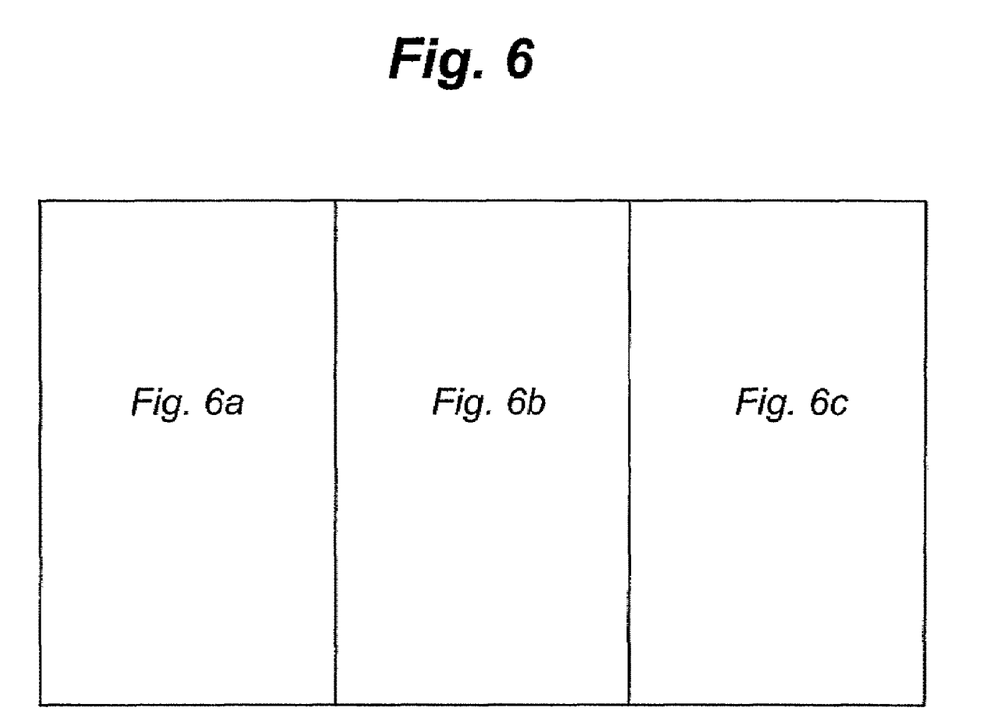
FIG. 6 is a diagram illustrating one exemplary embodiment of an output buffer having slew rate control according to the present invention, including a predriver circuit and feedback circuit for input slew rate and amplitude control.
Figure 6A:
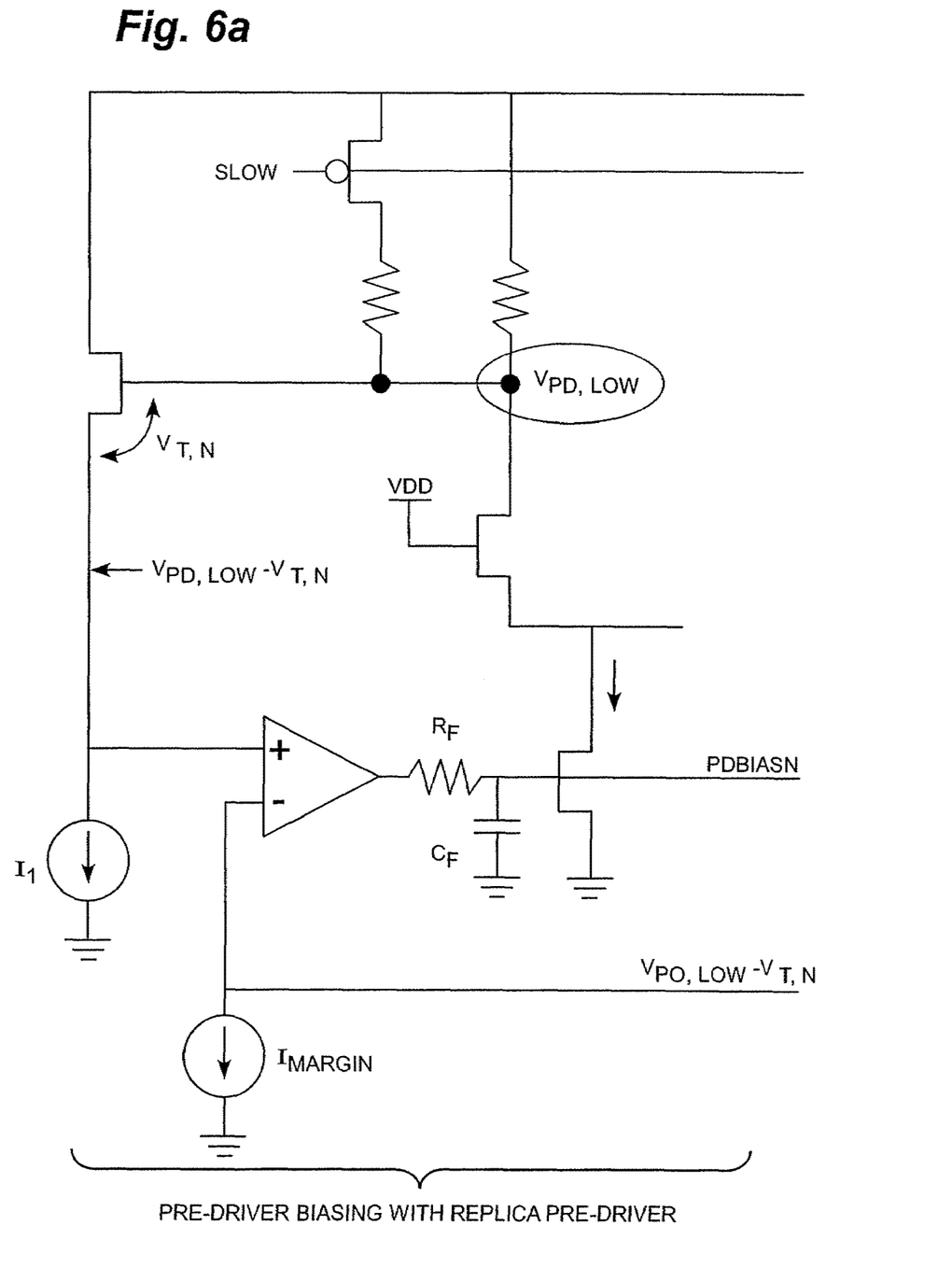
Figure 6B:
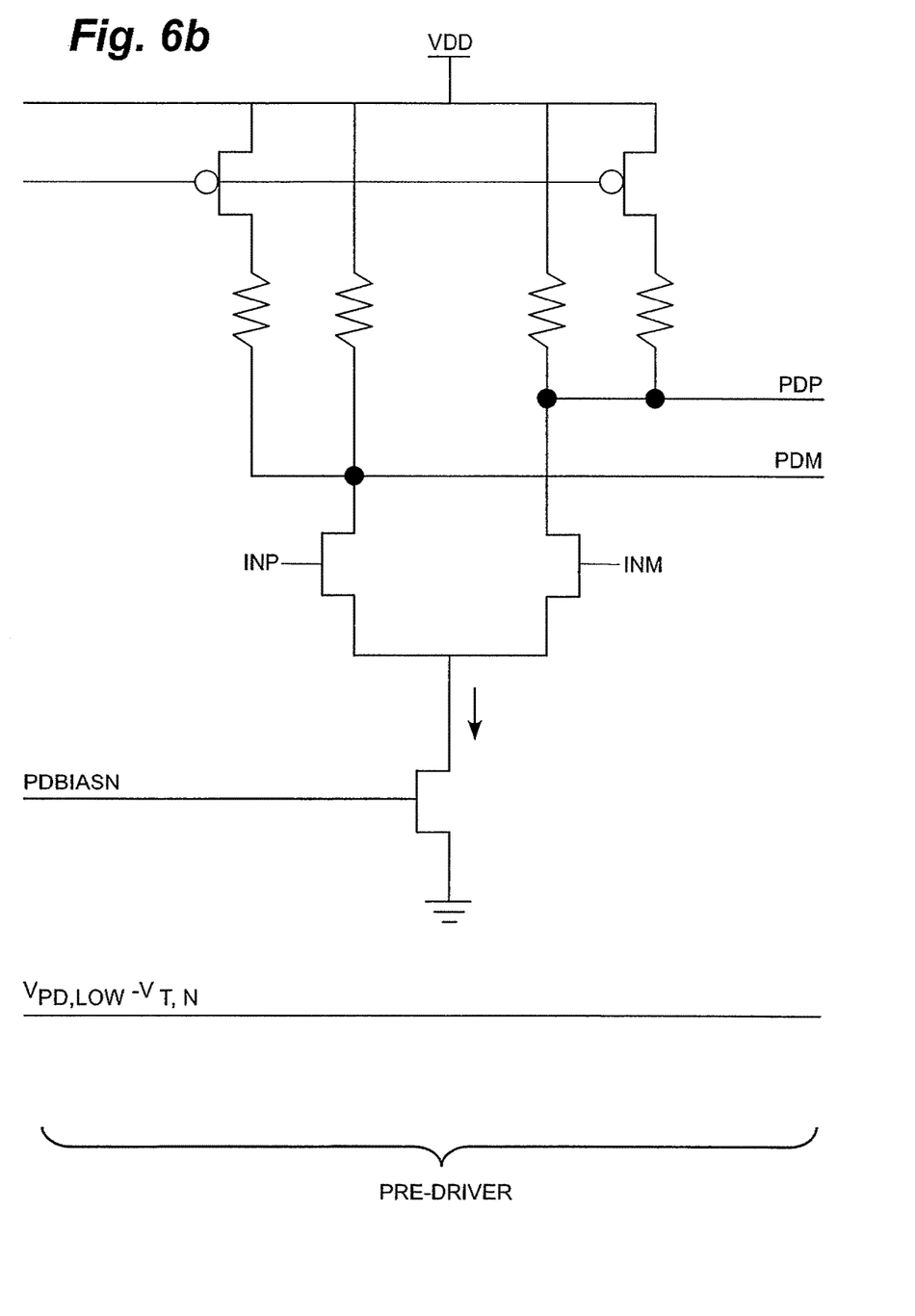
Figure 6C:
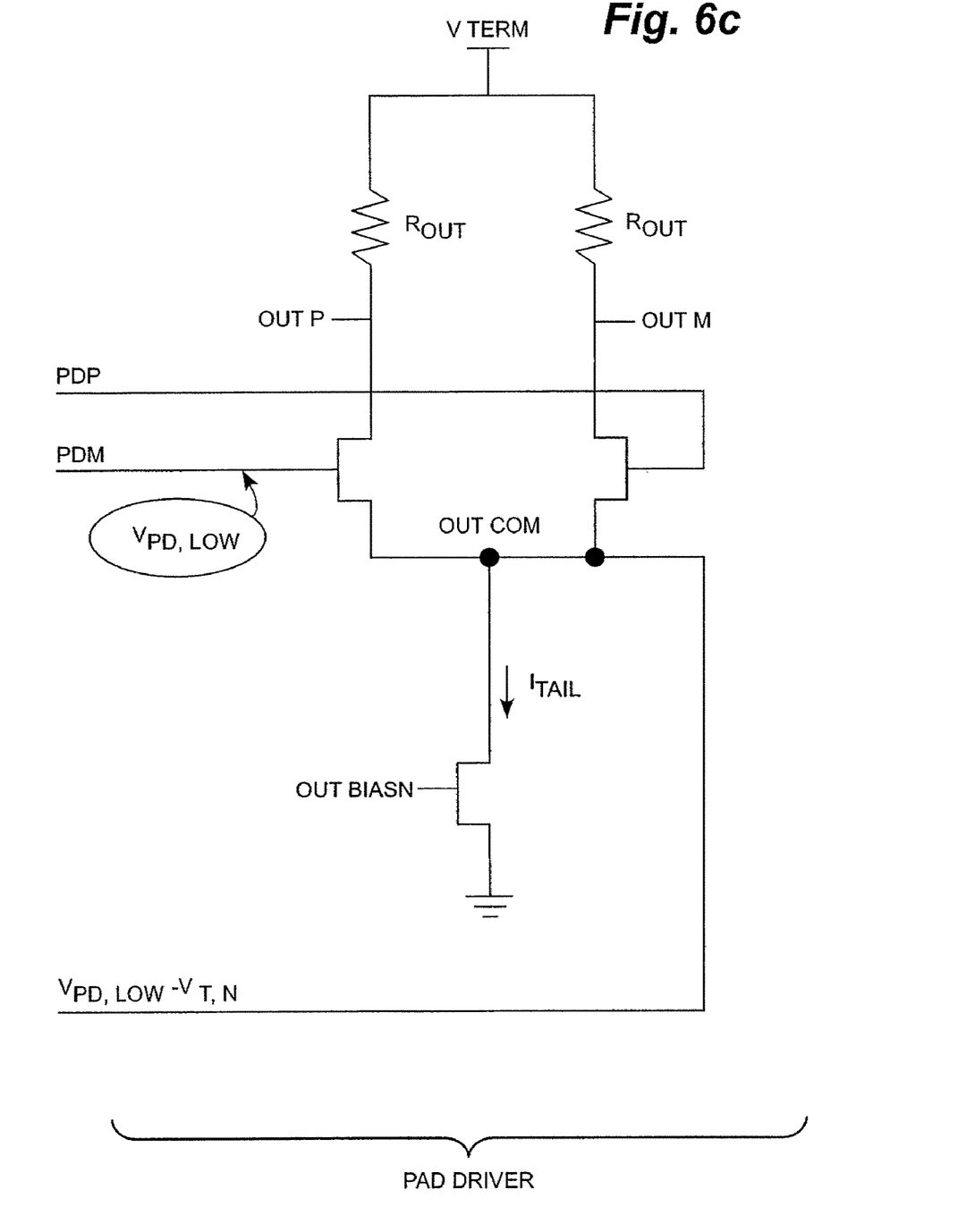

FIG. 6 illustrates one exemplary embodiment of an output buffer having a slew rate control, including a "pad driver" output driver or buffer, a pre-driver circuit and a feedback circuit for controlling the output amplitude of the pre-driver circuit, noted as a "pre-driver biasing with replica pre-driver." It is noted that the feedback loop is compensated by $R_F$ and $C_F$, forming a low-pass filter. Persons skilled in the relevant arts will recognize that other methods of compensation are possible. The output buffer common-source voltage OUTCOM is level shifted by drawing Imargin through Rmargin and this shifted voltage is applied to the op amp's inverting inputs. This results in an extra voltage swing of Isubmargin times Rmargin similar to the Vmargin illustrated in FIG. 5.

It is noted that not only does the output buffer according to the present invention allow for control of the output buffers output signal slew rate, but it does so while minimizing the power in the pre-driver. The output amplitude is as small as possible (yet still reliably completely switching the current in the output buffer over the desired output dynamic range), and its load resistance is relatively higher when SLOW is asserted, further reducing predriver power. Note that a single control bit "SLOW" is shown. It is a straight forward extension to have multiple, weighted SLOW bits, SLOW [O:N], so as to achieve a selectable range of slew rates. Likewise, a pulse-width modulated (PWM) signal or an analog signal can be used to control a range of slew rates.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein.

What is claimed is:

1. A Signal driver circuit having a controllable slew rate, comprising:

a pre-driver sub-circuit that includes a differential arrangement of gain elements and an adjustable load, wherein adjustment of the adjustable load varies an output slew rate of an output of the pre-driver sub-circuit;

an output driver sub-circuit having an input coupled with the output of the pre-driver sub-circuit, wherein the output driver output sub-circuit has a slew rate controllable by varying the slew rate of the output of the pre-driver sub-circuit and a dynamic range maintainable by controlling an amplitude of the output of the pre-driver sub-circuit; and a feedback arrangement coupled to the output driver sub-circuit and to the pre-driver sub-circuit, wherein the feedback arrangement operates to control the amplitude of the pre-driver output based on an output amplitude of the output driver whereby the slew rate of the pre-driver sub-circuit is selectably settable independently of the output amplitude of the output driver.

2. The signal driver circuit of claim 1, wherein the output driver sub-circuit includes a differential arrangement of gain elements.

3. The signal driver circuit of claim 2, wherein the gain elements are metal oxide semiconductor transistors.

4. The signal driver circuit of claim 1, wherein the feedback arrangement controls the amplitude of the output of the pre-driver sub-circuit such that an output dynamic range of the pre-driver sub-circuit is generally matched with the an input dynamic range of the output driver.

5. The signal driver circuit of the claim 1, wherein the feedback arrangement controls the amplitude of the output of the pre-driver sub-circuit such that the amplitude is generally minimally sufficient for the output driver sub-circuit to produce an output having fully dynamic range.

6. The signal driver circuit of claim 5, wherein the feedback arrangement controls the amplitude of the output of the pre-driver sub-circuit such that the amplitude is generally minimally sufficient for the output driver to produce an output having a selected dynamic range that is less than the full dynamic range.

7. The signal driver of claim 1, wherein the adjustable load includes an electronically-adjustable resistance.

8. The signal driver circuit of claim 1, wherein the adjustable load includes an electronically-adjustable time constant.

9. The signal driver circuit of claim 2, wherein the adjustable load includes a pair of load transistors, each load transistor corresponding with one side of the differential arrangement, wherein each load transistor is adapted to operate in at least a first mode having a first channel resistance and a second mode having a second channel resistance that is greater than the first channel resistance.

10. The signal driver circuit of claim 9, wherein each load transistor is adjustable in response to a digital signal representing a desire slew rate.

11. The signal driver circuit of claim 10, wherein the digital signal is a binary one-bit signal that represents a first slew rate during a first time interval and second different slew rate during a second different time interval.

12. The signal driver circuit of claim 10, wherein the digital signal is a multi-bit signal representing a desired slew rate among a plurality of possible slew rates.

13. The signal driver circuit of claim 1, wherein the adjustable load is adjustable between a relatively higher impedance and relatively lover impedance, wherein the relatively higher impedance corresponds to a relatively slower output slew rate and the relatively lower impedance corresponds to a relatively faster slew rate.

14. A method of controlling a slew rate of an output pad of an output buffer, the method comprising:

providing a pre-driver that drives an input of an output driver for the output pad; electronically selecting an output slew rate of the pre-driver among at least two electronically selectable slew rates; and controlling an output amplitude of the pre-driver independently of the output slew rate of the pre-driver such that the output amplitude is not greater than an amplitude that is generally minimally sufficient to cause the output driver to produce an output signal having a desired dynamic range.

15. The method of claim 14, further comprising:

automatically increasing a pre-driver load impedance in response to a slew rate control signal asserting a slowing down of the slew rate.

16. An integrated circuit (IC) output buffer, comprising:

means for generating an output driver input signal having an adjustable output slew rate and an adjustable output amplitude that are adjustable independent of each other;

means for driving an output signal, coupled with means for generating and adapted to produce the output signal having a slew rate proportional to the adjustable output slew rate; and means for controlling a feedback loop coupled with the means for generating and the means for driving, and adapted to control the adjustable output amplitude based on a monitored amplitude of the output signal independent of the output slew rate.

* * * * *